United States Patent [19]
Furukawa et al.

[11] Patent Number: 6,017,807
[45] Date of Patent: Jan. 25, 2000

[54] P-TYPE GAN COMPOUND SEMICONDUCTOR AND METHOD FOR MANUFACTURING THE SAME

[75] Inventors: Chisato Furukawa; Masayuki Ishikawa; Hideto Sugawara; Kenji Isomoto, all of Tokyo, Japan

[73] Assignee: Kabushiki Kaisha Toshba, Kanagawa-ken, Japan

[21] Appl. No.: 09/060,068

[22] Filed: Apr. 15, 1998

[30] Foreign Application Priority Data

Apr. 17, 1997 [JP] Japan .................................. 9-100506

[51] Int. Cl.$^7$ ................................................. H01L 31/18
[52] U.S. Cl. ............................. 438/502; 438/509; 117/89; 257/103
[58] Field of Search ............... 117/89; 438/502, 438/509

[56] References Cited

U.S. PATENT DOCUMENTS 5,468,678  11/1995  Nakamura et al. ..................... 437/107

*Primary Examiner*—Olik Chaudhuri
*Assistant Examiner*—Douglas A. Wille
*Attorney, Agent, or Firm*—Finnegan, Henderson, Farabow, Garrett & Dunner, L.L.P.

[57] ABSTRACT

After p-type gallium nitride compound semiconductor layers, to which p-type impurity is added, are formed by virtue of chemical vapor deposition, the p-type gallium nitride compound semiconductor layers are thermally annealed at more than 400° C. or more than 700° C. while supplying a flow of an inert gas in parallel to a substrate surface at a predetermined flow rate or more. Otherwise, the p-type gallium nitride compound semiconductor layers are thermally annealed at more than 400° C. or more than 700° C. in an inert gas atmosphere having a predetermined pressure or more. According to the annealing process, the p-type impurity can be more effectively activated, so that p-type gallium nitride compound semiconductor layers which have fewer crystal defects, etc. and have lower resistivity can be formed.

8 Claims, 6 Drawing Sheets

P-TYPE GAN COMPOUND SEMICONDUCTOR AND METHOD FOR MANUFACTURING THE SAME

BACKGROUND OF THE INVENTION

1. Field of the Invention

The present invention relates to a gallium nitride (GaN) compound semiconductor and a method for manufacturing the same and, more particularly, a p-type GaN compound semiconductor, a method for manufacturing the same, and a light emitting device having the p-type GaN compound semiconductor.

2. Description of the Related Art

In recent years, a GaN compound semiconductor represented by a general expression $Al(x)In(y)Ga(1-x-y)N$ ($1 \geq x \geq 0$, $1 \geq y \geq 0$) has been watched with interest as an excellent material for a blue light-emitting device.

A blue light-emitting diode using the GaN compound semiconductors is made up of a plurality of p-type, n-type or i-type GaN compound semiconductor layers which are formed by the MOCVD (Metal Organic Chemical Vapor Deposition) method or the MBE (Molecular Beam Epitaxy) method on a sapphire substrate.

For example, a PN junction type blue light-emitting diode consists of a buffer layer which is made of a GaN layer formed on the sapphire substrate and a laminated structure which is made up of an n-type GaN layer and a p-type GaN layer both being formed on the buffer layer. In addition, a double-hetero (DH) structure blue light-emitting diode is composed of a buffer layer formed on the sapphire substrate, an n-type GaN layer formed on the buffer layer, a substantially intrinsic i-type $Al(x)Ga(1-x)N$ ($1 \geq x \geq 0$) layer formed on the n-type GaN layer and called an active layer, and a p-type GaN layer formed on the i-type $Al(x)Ga(1-x)N$ layer.

In this fashion, in order to manufacture an electronic device such as a light emitting device by use of the GaN compound semiconductor, there is necessity of forming at least a laminated structure which consists of n-type and p-type conductivity GaN compound semiconductor layers.

Normally, if undoped GaN compound semiconductors are to be formed by the MOCVD method, trimethylgallium (TMG), trimethylaluminum (TMA), ammonia (NH3), etc. are employed as a reaction gas, and hydrogen (H2) gas, etc. are employed as a carrier gas. At this time, a substrate temperature is set in the range of 800° C. to 1200° C.

If a monosilane (SiH4) gas, for example, is added as an n-type doping gas together with the reaction gas, a low-resistivity n-type GaN compound semiconductor can be formed.

However, even if a p-type doping gas, e.g., cyclopentadienyl magnesium (Cp2Mg) together with the reaction gas is added in the same manner as the case where the n-type GaN compound semiconductor is formed, a film obtained immediately after deposition (i.e., as-deposited film) is not a low-resistivity p-type GaN compound semiconductor. This is because Mg serving as the impurity is added to the film but it cannot be activated, so that such Mg cannot serve as an acceptor. As a result, such as-deposited film cannot be employed for the p-type GaN compound semiconductor layer constituting a light emitting device. Similarly, such tendency also appears even if other p-type impurity such as Zn is added.

The reason has not been sufficiently apparent why the GaN compound semiconductor, to which the p-type impurity is added, is difficult to exhibit the p-type electronic property. However, in general it has been understood that added Mg, Zn, etc. are bonded with hydrogen to thus generate Mg-H bond, Zn-H bond, etc.

More particularly, it has been supposed that NH3 employed as a nitrogen (N) source is dissociated to generate atomic hydrogen during when the GaN compound semiconductor is formed with the use of the MOCVD method, and then such atomic hydrogen reacts with Mg, Zn, etc. added as the p-type impurity to thus generate Mg-H bond, Zn-H bond, etc.

In Japanese Patent Publication No. 218625 of 1991, a method of activating the p-type impurity by forming the GaN film to which Mg as P-type impurity is added, and then annealing the GaN film at a temperature of more than 400° C. has been disclosed. In this Publication (KOKAI) Hei 3-218625, such fact has been set forth that, according to this method, a carrier concentration serving as the acceptor (referred to as "acceptor concentration" hereinafter) of $8 \times 10^{10}$ $cm^{-3}$ in the as-deposited film can be improved up to the acceptor concentration of $2 \times 10^{17}$ $cm^{-3}$ by the annealing. It has been known that, because the Mg-H bond is dissociated by applying heat to the as-deposited film, the p-type impurity is electrically activated in this method.

SUMMARY OF THE INVENTION

It is an object of the present invention to provide a method for manufacturing a new p-type gallium nitride (GaN) compound semiconductor capable of activating more effectively a p-type impurity which is added to a gallium nitride compound semiconductor, and a p-type GaN compound semiconductor manufactured according to this manufacturing method.

It is another object of the present invention to provide a blue light-emitting device employing the p-type GaN compound semiconductor manufactured according to the above manufacturing method.

In order to achieve the above objects, according to an aspect of the present invention, there is provided a method for manufacturing p-type gallium nitride compound semiconductor layers, comprising the steps of forming p-type gallium nitride compound semiconductor layers, to which p-type impurity is added, by virtue of chemical vapor deposition; and thermally annealing the p-type gallium nitride compound semiconductor layers at more than 400° C. while supplying a flow of an inert gas in parallel to at least surfaces of the p-type gallium nitride compound semiconductor layers; wherein a flow rate of the inert gas is set to more than 0.3 SCCM per unit sectional area perpendicular to a flow direction.

Accordingly, the activation yield of the p-type impurity can be improved by a simple process. As a result, the p-type gallium nitride compound semiconductor layers which have lower resistivity and good quality can be provided.

If the substrate temperature is set to more than 700° C. or the flow rate of the inert gas is set to more than 0.5 SCCM, the p-type gallium nitride compound semiconductor layers which have lower resistivity and good quality can be fabricated more stably with good reproducibility.

According to another aspect of the present invention, there is provided a method for manufacturing p-type gallium nitride compound semiconductor layers, comprising the steps of forming p-type gallium nitride compound semiconductor layers, to which p-type impurity is added, by virtue of chemical vapor deposition; and thermally annealing the p-type gallium nitride compound semiconductor layers at more than 400° C. in an inert gas atmosphere; wherein the inert gas atmosphere is set to more than 1 atm.

Accordingly, the activation yield of the p-type impurity can be improved by a simple process. As a result, the p-type gallium nitride compound semiconductor layers which have lower resistivity and good quality can be provided.

If the substrate temperature is set to more than 700° C., the p-type gallium nitride compound semiconductor layers which have lower resistivity and good quality can be fabricated more stably with good reproducibility.

If n-type gallium nitride compound semiconductor layers or i-type gallium nitride compound semiconductor layers are added further to the p-type gallium nitride compound semiconductor layers manufactured by the manufacturing method, a blue light-emitting device can be obtained.

According to the blue light-emitting device, a gallium nitride blue light-emitting device which has strong light emission intensity and small power consumption can be provided.

Other and further objects and features of the present invention will become obvious upon an understanding of the illustrative embodiments about to be described in connection with the accompanying drawings or will be indicated in the appended claims, and various advantages not referred to herein will be occur to one skilled in the art upon employing of the present invention in practice.

BRIEF DESCRIPTION OF THE DRAWINGS

FIGS. 1A to 1C are schematic sectional views showing typical examples of annealing equipments used in embodiments of the present invention respectively, wherein FIG. 1A shows an open type quartz tube having both open ends, FIG. 1B shows a semi-sealing type quartz tube having one open end and one sealed end, and FIG. 1C shows a sealing type quartz tube having both sealed ends;

DESCRIPTION OF THE PREFERRED EMBODIMENTS

Various embodiments of the present invention will be explained in detail with reference to the accompanying drawings hereinafter.

I. First Embodiment

A first embodiment of the present invention is a method for manufacturing a p-type GaN compound semiconductor. More particularly, in the first embodiment of the present invention, a method for manufacturing a single layer p-type GaN compound semiconductor will be explained with reference to FIGS. 1A, 1B and FIG. 2 hereunder.

Figure 1A:
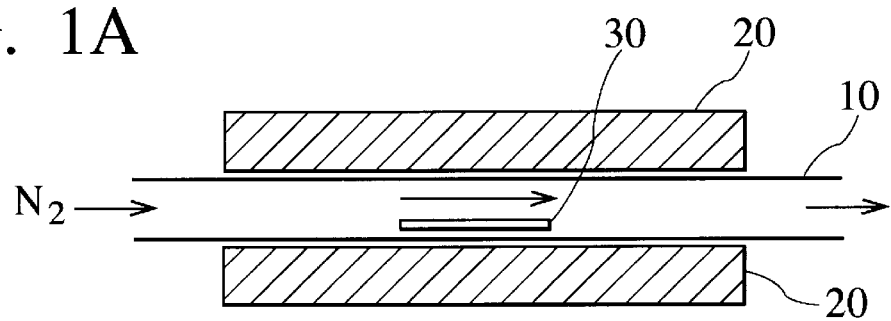
Figure 1B:
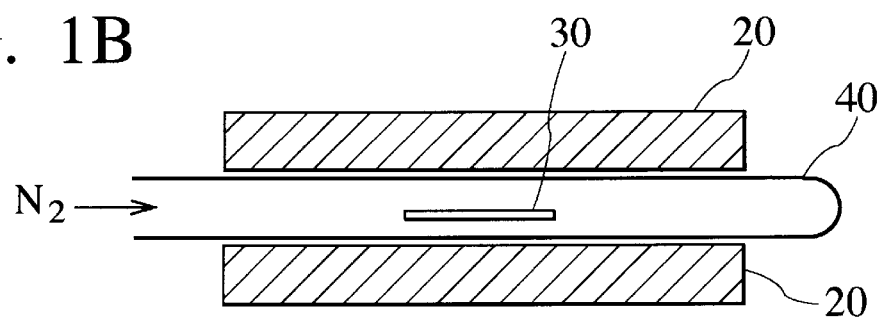

FIGS. 1A, 1B show typical examples of annealing equipments used in embodiments of the present invention respectively.

A principal feature of the first embodiment resides in that the p-type impurity added to the film can be activated by forming the GaN compound semiconductor film to which the p-type impurity is added by virtue of the MOCVD method, etc. and then annealing the film while flowing an inert gas at a predetermined flow rate or more.

An effect or influence of the flow rate of the inert gas in the annealing process upon the p-type impurity included in the GaN compound semiconductor has been checked or confirmed by using a sample in which a single layer GaN compound semiconductor layer is formed on a sapphire substrate. Results of such confirmation will be explained hereunder.

As the sample, an about 2 $\mu$m thick GaN film which is formed on the sapphire substrate by virtue of the MOCVD method and into which the p-type impurity is added is employed. As film forming conditions, a substrate temperature is set to about 1000 to 1200° C. and an ambient pressure is set to 1 atm. Trimethylgallium (TMG) and ammonia (NH3) are used as the reaction gas, and cyclopentadienyl magnesium (Cp2Mg) is used as a dopant gas, and nitrogen (N2) and hydrogen (H2) are used as a carrier gas. As for the flow rates of respective gases, TMG is set at 100 SCCM, NH3 is set at 10 SLM, Cp2Mg is set at 50 SCCM, N2 is set at 5 SLM, and H2 is set at 15 SLM.

In the as-deposited GaN film, Mg of about $1\times10^{20}$ cm$^{-3}$ has been added, but it has been found, according to the measurement by virtue of the common capacitance-voltage measurement method (C-V method), that the acceptor concentration contributing to the conductivity type is less than a measuring limit. Therefore, it seems that the acceptor concentration is at most less than $1\times10^{17}$ cm$^{-3}$.

Next, the substrate on which the GaN film is formed is unloaded from the MOCVD chamber and then annealing process is performed by the following method. As shown in FIG. 1A, an annealing equipment used for the annealing process is constructed by passing through a quartz tube 10 with its both open ends into an electric furnace 20. A diameter of the quartz tube 10 used is 3.5 to 6 inch.

First, a substrate 30 is placed in a central area of the quartz tube 10, and then an interior of the quartz tube 10 is replaced with N2. Then, the substrate temperature is increased up to 700° C. while supplying N2 at a constant flow rate in parallel to the surface of the substrate 30. When the substrate temperature comes up to 700° C., the temperature is maintained for about ten minutes. Then, the substrate 30 is cooled down to room temperature.

A plurality of GaN film samples have been subjected to annealing processes respectively while only a flow rate of an N2 gas supplied in annealing is changed but other conditions are set identical. After the annealing process, the acceptor concentration in respective GaN films of the samples has been measured.

Figure 2:
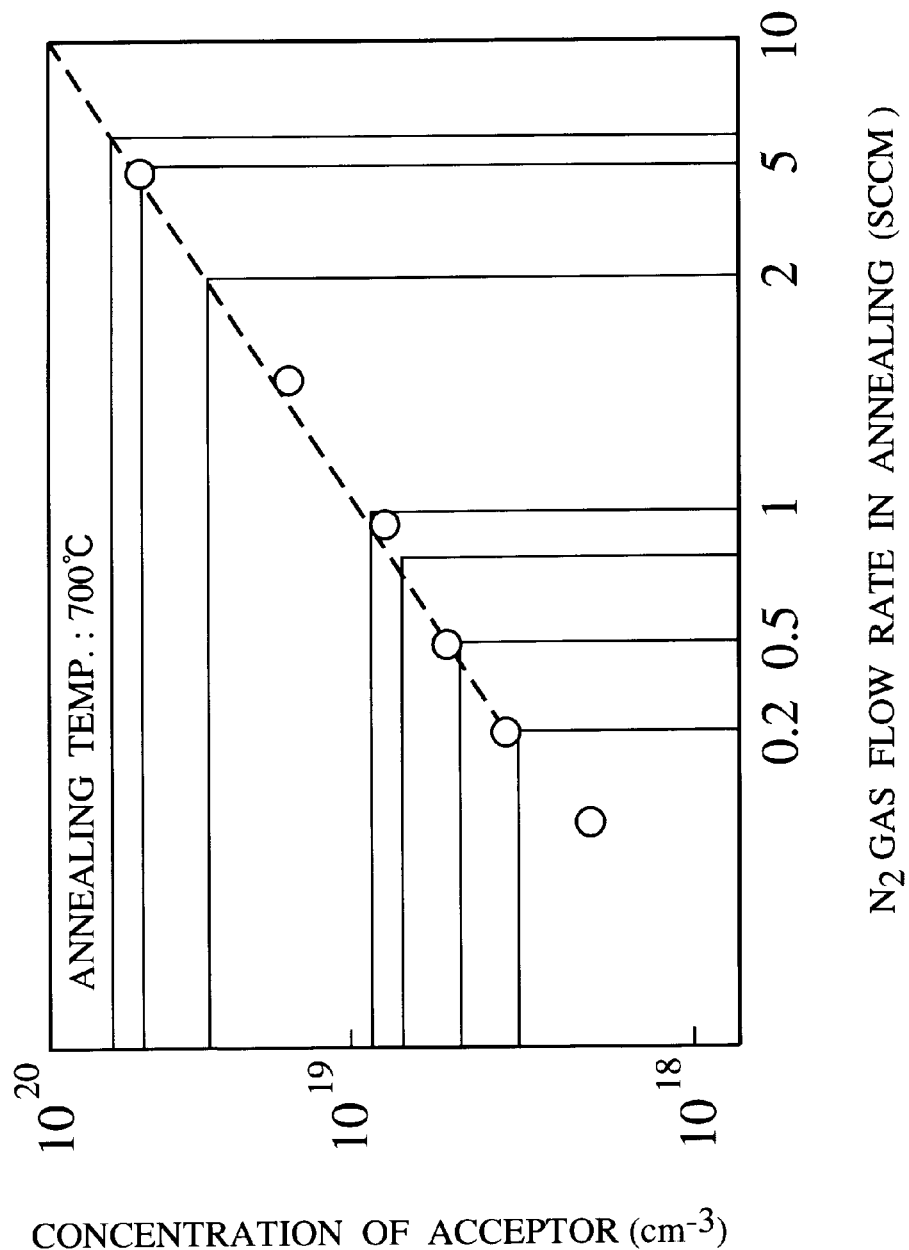
FIG. 2 is a graph showing a relationship between a flow rate of an inert gas supplied in annealing and an acceptor concentration according to a first embodiment of the present invention.

FIG. 2 shows a relationship between the flow rate of the N2 gas supplied in annealing and the acceptor concentration according to the first embodiment of the present invention. The graph in FIG. 2 has double logarithmic scales as its abscissa and ordinate. In FIG. 2, the abscissa indicates the flow rate of N2 gas supplied and the ordinate indicates the acceptor concentration in the GaN film. Where the term "flow rate of N2 gas" means a flow rate per unit sectional area (1 mm$^2$) which is converted by dividing a total flow rate of N2 by a sectional area of the quartz tube 10 perpendicular to the gas flow. The total flow rate is measured by a massflow mater set in a pipe for supplying inert gas to the quarts tube 10.

The acceptor concentration in the GaN film has a significant dependence upon the flow rate of the N2 gas supplied in annealing. The acceptor concentration has been increased as the flow rate of the N2 gas is increased. In particular, such tendency has remarkably appeared when the flow rate of the N2 gas is in excess of 0.3 SCCM. As shown in the graph of FIG. 2, a relationship between the flow rate of N2 gas and the acceptor concentration has been indicated linearly substantially on the double logarithmic scales graph.

The flow rate of the N2 gas per unit sectional area corresponds to the velocity of the N2 gas. From this graph, it is possible to say that the acceptor concentration can be increased as the velocity of the N2 gas is increased.

When the annealing process is performed at 700° C. under the condition that the flow rate of the N2 gas is zero, the acceptor concentration is about $10^{18}$ cm$^{-3}$ and thus an activation yield, i.e., a ratio of the acceptor concentration to the Mg impurity concentration in the GaN film is merely about 1%.

However, if the flow rate of the N2 gas is set to 0.5 SCCM, the acceptor concentration becomes about $5 \times 10^{18}$ cm$^{-3}$ and thus the activation yield can be increased up to about 5%. This flow rate of 0.5 SCCM, if converted into an average linear velocity of the N2, can be represented by about 0.5 mm/min.

Then, if the flow rate of the N2 gas is set to 1 SCCM, the acceptor concentration becomes about 3 to $5 \times 10^{18}$ cm$^{-3}$ and thus the activation yield can be further increased. Then, if the flow rate of the N2 gas is set to more than 1.5 SCCM, the acceptor concentration becomes $6 \times 10^{18}$ to $1.7 \times 10^{19}$ cm$^{-3}$. As discussed above, it should be noted that the activation yield of the p-type impurity added to the GaN film has been able to be improved by supplying the N2 gas at the flow rate of more than 0.3 SCCM in annealing.

Usually, it is feasible to employ the GaN film having the acceptor concentration of more than $7 \times 10^{17}$ cm$^{-3}$ as a p-type cladding layer for a DH type blue light-emitting diode to be described later. In addition, the GaN film having the acceptor concentration of more than $1 \times 10^{19}$ cm$^{-3}$ can be used as the contact layer since it is able to have a good ohmic contact with an electrode.

The impurity which cannot act as the acceptor, even though added to the film, generates lattice defects in the crystal to thus degrade its crystalline property, and then becomes easily trap centers of the carrier such as the hole, electron, etc. Therefore, if the film has the higher activation yield, i.e., if the flow rate of the N2 gas in annealing is higher, the lattice defect, etc. can be reduced fewer in the film having the identical acceptor concentration and thus a low-resistivity and good quality film can be obtained.

It has not been yet apparent why the annealing process performed in the N2 gas flow can improve the activation yield of the p-type GaN film. However, it has been said commonly that, if the effects for thermally cutting off Mg-H bond and also dissociating the hydrogen gas from the GaN film can be achieved by the annealing process, the N2 gas flow in annealing can take the hydrogen dissociated from the GaN film away effectively and thus can always refresh the surface of the GaN film. As a result, it can be deduced that the hydrogen concentration at the gas boundary layer on the surface of the substrate 30 can be suppressed lower by the annealing process and that a reaction rate of the hydrogen dissociation can be enhanced by a concentration gradient effect. Similarly, such effect can be expected even if other inert gas such as argon (Ar), helium (He), or the like in place of the N2 gas is employed.

In addition, it is suggested that the annealing process of the GaN film in the N2 gas flow also has effects which can suppress dissociation of N from the GaN film, which is easily generated at the high temperature, and also suppress a collapse of the crystalline structure because of the dissociation of N. In particular, it is supposed that acceleration of the N2 gas flow can enhance the local N2 pressure of the substrate surface and can also suppress effectively the dissociation of N from the GaN film.

As described above, the activation yield of about 1% can be achieved at best if, as in the prior art, the GaN compound semiconductor is formed by using the MOCVD method and then merely the annealing process is performed. On the contrary, if the annealing process is carried out while flowing the N2 gas, the activation yield is ready to exceed more than 5%. As a result, the GaN compound semiconductor film having a low-resistivity, a high luminous efficiency, and good quality can be provided.

In the above first embodiment, the example has been discussed wherein, as shown in FIG. 1A, the annealing process has been performed by use of the cylindrical quartz tube 10 having both open ends. However, as shown in FIG. 1B, the semi-sealing type cylindrical chamber which is made of the quartz tube 40 having one sealed end and one open end may be employed. Further, the annealing time may be set to more than ten minutes.

With the above, the case where the substrate temperature is set to 700° C. has been explained. However, according to the present inventors' experiment, even if the substrate temperature is changed in the range from 700° C. to 1100° C., significant difference of the activation yield from that obtained when the substrate temperature is set to 700° C. has not been recognized or detected.

If the substrate temperature is set to below 400° C. in annealing, it seldom shows the effect of activating the p-type impurity in the film. Then, if the substrate temperature is set in the range of 400° C. to 700° C. in annealing, the activation yield also depends upon the substrate temperature. If the substrate temperature becomes higher, the activation yield also becomes higher. Therefore, in order to obtain the stable and high activation yield, it is preferable to set the substrate temperature to more than 700° C. In this case, thermal load for the annealing equipment becomes higher if the substrate temperature is set to exceed 1100° C.

In order to form the low-resistivity p-type GaN film with good reproducibility, it is preferable that the flow rate of the gas in annealing is set to obtain the activation yield as high as possible, for example, the activation yield of more than 5%.

Although Mg has been employed as the p-type impurity in the above first embodiment, other p-type impurity such as zinc (Zn), beryllium (Be), or the like may be employed other than Mg. Also, the annealing equipment has been employed separately from the MOCVD equipment, but first the film can be formed by the MOCVD method and then annealed in the same chamber.

II. Second Embodiment

A second embodiment of the present invention is a method for manufacturing the p-type GaN compound semiconductor. More particularly, in the second embodiment of the present invention, a method for manufacturing a single layer p-type GaN compound semiconductor will be explained with reference to FIGS. 1B, 1C and FIG. 3 hereunder.

Figure 1C:
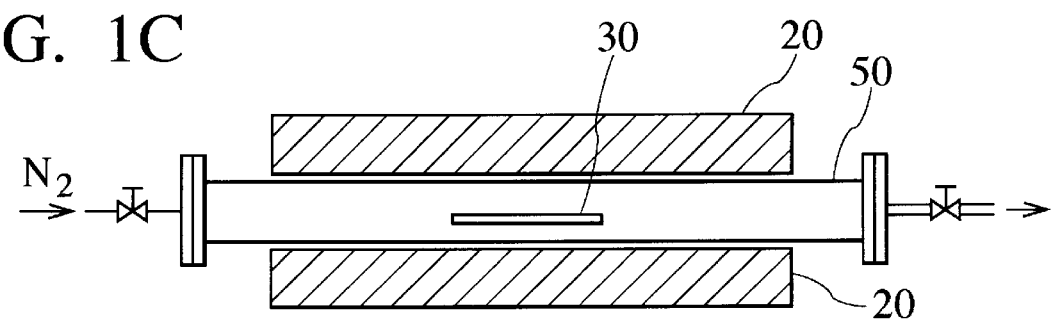

FIG. 1C shows a typical example of the annealing equipment used in embodiments of the present invention.

A principal feature of the second embodiment resides in that first the GaN compound semiconductor to which the p-type impurity is added is formed by virtue of the MOCVD method and then the film is subjected to annealing process under applying pressure of the inert gas atmosphere.

An effect of the pressure application of the inert gas in annealing upon the activation of the p-type impurity in the GaN compound semiconductor has been checked or confirmed by use of a sample in which a single layer of the GaN compound semiconductor layer is formed on the sapphire substrate 30. Such results of confirmation will be explained hereunder.

First, under the same conditions as those in the first embodiment, the GaN film of an about 2 μm thickness including the p-type impurity has been formed by the MOCVD method on the sapphire substrate 30. Like the first embodiment, Mg of about $1\times10^{20}$ cm$^{-3}$ has been added as the impurity in the GaN film immediately after deposition (i.e., as-deposited GaN film).

Then, the substrate on which the GaN film is formed has been loaded in the annealing equipment to be subjected to the annealing process. As shown in FIG. 1C, the equipment used for the annealing process is constructed by passing through the sealing type quartz tube 50 having both sealed ends into the electric furnace 20.

The substrate 30 has been placed in the central area of the quartz tube 50, and then the interior of the quartz tube 50 has been replaced with the N2 gas. Thereafter, a valve provided on the exhaust side of the quartz tube 50 has been closed, and then the N2 gas supplied to the interior of the quartz tube 50 has been adjusted to a predetermined pressure at more than 1 atm. At the same time, the temperature of the substrate 30 has been increased and then kept at 700° C. for about ten minutes.

Figure 3:
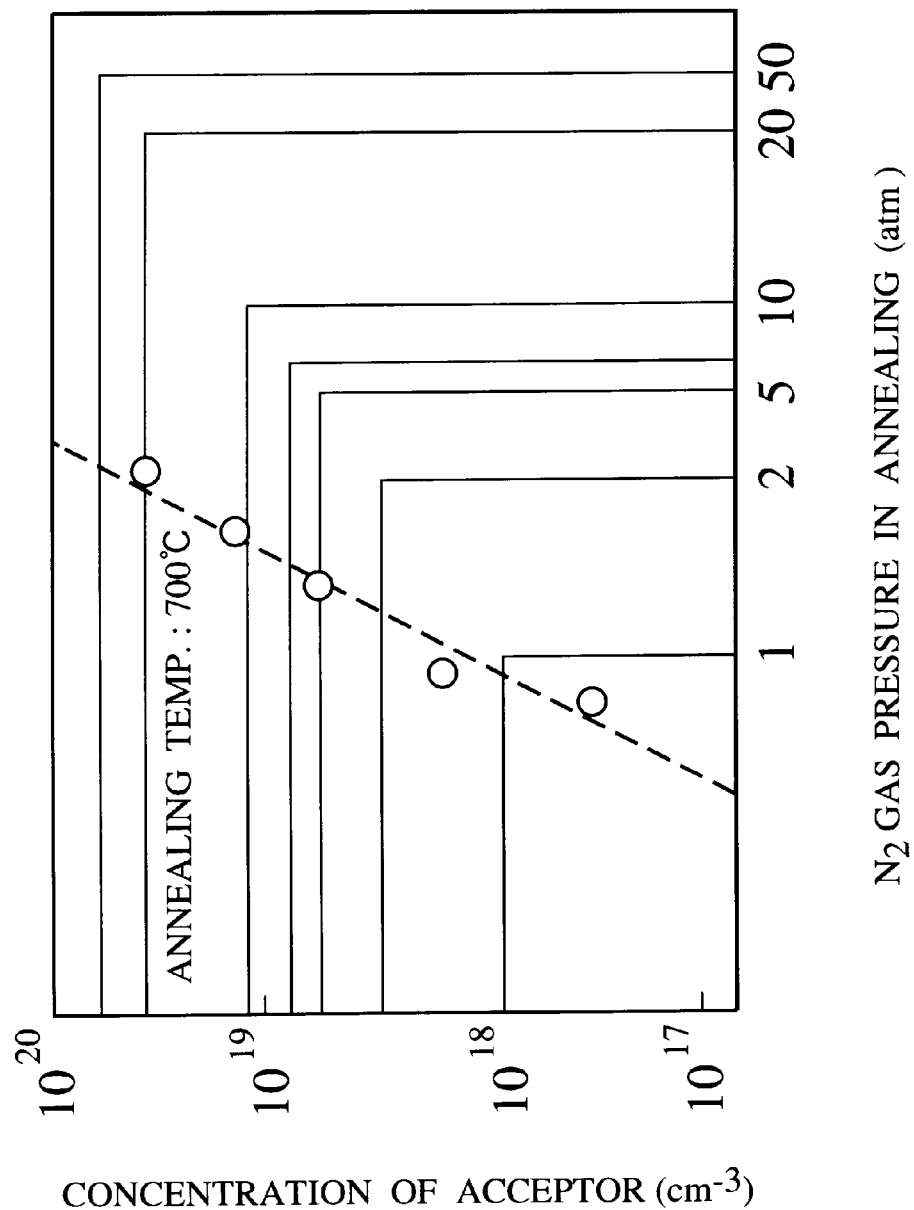
FIG. 3 is a graph showing a relationship between an ambient pressure of the inert gas supplied in annealing and the acceptor concentration according to a second embodiment of the present invention.

FIG. 3 shows a relationship between an ambient pressure of the inert gas supplied in annealing and the acceptor concentration in the GaN film according to a second embodiment of the present invention. The graph in FIG. 3 has double logarithmic scales. In FIG. 3, the abscissa indicates pressure of the N2 gas and the ordinate indicates the acceptor concentration in the GaN film.

As evident from the graph in FIG. 3, the acceptor concentration in the GaN film has depended considerably upon the ambient pressure in annealing. The acceptor concentration has been increased as the ambient pressure is increased. A relationship between the acceptor concentration and the ambient pressure can be indicated substantially linearly on the double logarithmic scale graph.

For instance, if the N2 gas pressure is lower than 1 atm, an increase in the activation yield due to the annealing process has hardly observed or detected. But the acceptor concentration has become 1 to $1.5\times10^{18}$ cm$^{-3}$ at the N2 gas pressure of 1 atm. Then, the acceptor concentration has reached 1 to $1.7\times10^{19}$ cm$^{-3}$ at the N2gas pressure is 5 atm.

If the N2 gas pressure in annealing is set to more than 1 atm, the activation yield, i.e., the ratio of the acceptor concentration to the Mg impurity concentration in the GaN film can be set in the range of 3 to 5%.

The reason why the electric activation yield of Mg added to the GaN film can be improved remarkably by increasing the N2 gas pressure in annealing has not been made clear yet. However, at least there can be supposed that the high N2 gas pressure can suppress dissociation of N from the GaN film, which is readily caused in the annealing process, and therefore collapse of the crystalline structure due to dissociation of N can be prevented.

Similar effects can be expected if the inert gas except for the N2 gas is employed.

In the above second embodiment, as shown in FIG. 1C, the example has been discussed in which the annealing process has been carried out by use of the sealing type cylindrical quartz tube 50. But, as shown in FIG. 1B, the semi-sealing type cylindrical chamber may be employed which is made of the quartz tube 40 having one sealed end and one open end. In addition, any chambers other than these equipments may be employed if they can heat up the substrate temperature beyond 700° C. under application of the pressure.

III. Third Embodiment

A third embodiment of the present invention is a method for manufacturing the p-type GaN compound semiconductor. More particularly, annealing process employing the annealing process in the above first embodiment and the annealing process in the second embodiment in combination will be explained with reference to FIGS. 1A to 1C, FIG. 2, and FIG. 3 hereunder. An effect of increasing the activation yield of the p-type impurity which is added to the GaN compound semiconductor can also be expected according to such annealing process.

A feature of the third embodiment resides in that first the GaN compound semiconductor film to which the p-type impurity is added is formed by the MOCVD method, etc., and then the annealing process is performed under applying the pressure of the inert gas atmosphere and while flowing the inert gas.

For example, the GaN film to which impurity of Mg is added is formed by the MOCVD method on the substrate 30. Then, as shown in FIG. 1C, the substrate 30 is loaded in the sealing type quartz tube 50, then the interior of the quartz tube 50 is replaced with the N2 gas, and then the interior of the quartz tube 50 is set finally to a constant pressure of more than 1 atm, for example, 5 atm. While adjusting both the supply valve and the exhaust valve to maintain the pressure in the reaction tube 50, the N2 gas is supplied at the flow rate of more than 5 SCCM per unit sectional area of the reaction tube 50. Then, the substrate 30 is heated up to 700° C. and then the temperature of the substrate 30 is kept at 700° C. for about ten minutes.

As described above, if the annealing process employing the flow rate effect of the inert gas and the pressure applying effect due to the inert gas in combination is performed, the p-type GaN compound semiconductor having the high activation yield can be achieved.

IV. Fourth Embodiment

A fourth embodiment of the present invention is manufacture of a blue light-emitting diode. More particularly, in the fourth embodiment of the present invention, a method for manufacturing a blue light-emitting diode using the p-type GaN compound semiconductor discussed in the above first embodiment will be explained hereunder.

FIGS. 4A to 4F show sectional shapes of a device according to steps of manufacturing the DH type blue light-emitting diode according to the fourth embodiment of the present invention. FIG. 5 shows a structure of the PN junction type blue light-emitting diode according to the fourth embodiment of the present invention.

Figure 4A:
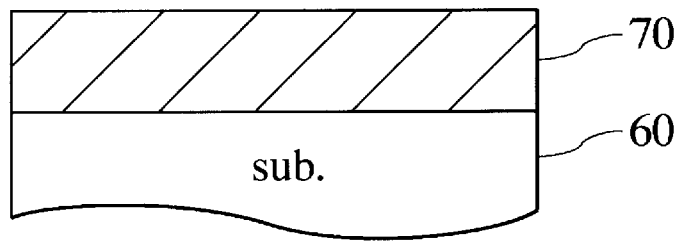
FIGS. 4A to 4F are sectional views showing sectional shapes according to steps of manufacturing a DH type blue light-emitting diode according to a fourth embodiment of the present invention.
Figure 5:
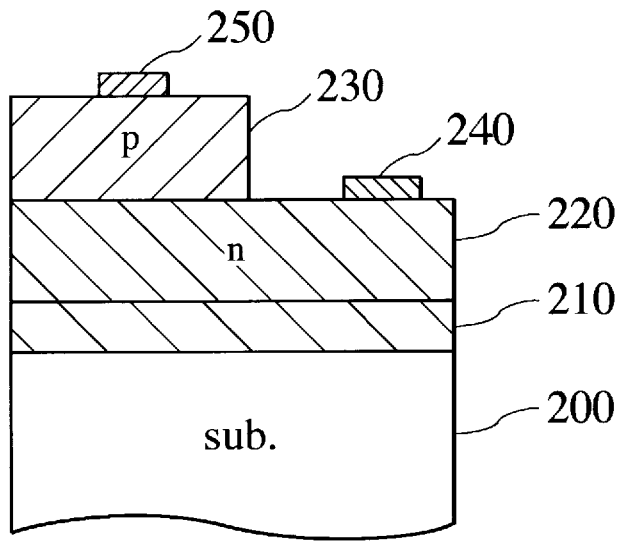
FIG. 5 is a sectional view showing a structure of a PN junction type blue light-emitting diode according to the fourth embodiment of the present invention.

At first, as shown in FIG. 4A, a buffer layer 70 of about 1.8 μm thickness is formed of an undoped GaN film on a sapphire substrate 60 by the MOCVD method.

As the conditions of the MOCVD method, the substrate temperature is set to about 1100° C. and the ambient pressure is set to about 1 atm, for example. Trimethylgallium (TMG) and ammonia (NH3) are used as the reaction gas, and nitrogen (N2) and hydrogen (H2) are used as the carrier gas. As for the flow rates of respective gases, TMG is set at 100 SCCM, NH3 is set at 10 SLM, N2 is set at 5 SLM, and H2 is set at 20 SLM.

All the buffer layer 70, an n-type cladding layer 80, an active layer 90, a p-type cladding layer (contact layer) 100, which being described later, can be formed by the MOCVD method and also major reaction gases used at the method can be used commonly. Therefore, for simplicity of process, it is preferable that respective film formations should be performed continuously in the same chamber.

Figure 4B:
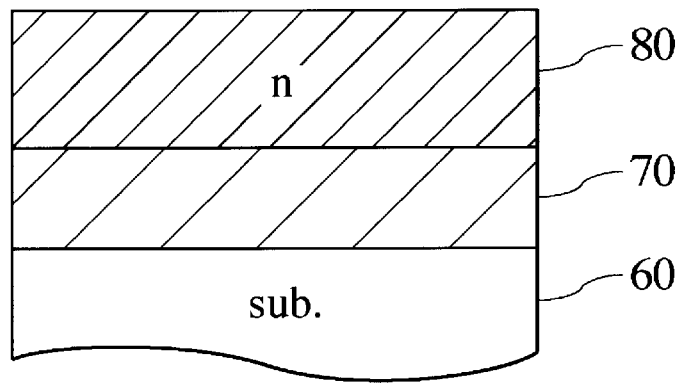

Then, as shown in FIG. 4B, the n-type cladding layer 80 of about 4 μm thickness is formed of the GaN film on the buffer layer 70 by the MOCVD method. Except that a monosilane (SiH4) gas is added at the flow rate of 10 SCCM to the reaction gas as the doping gas, film forming conditions of the n-type cladding layer 80 are the same as those of the above buffer layer 70.

Figure 4C:
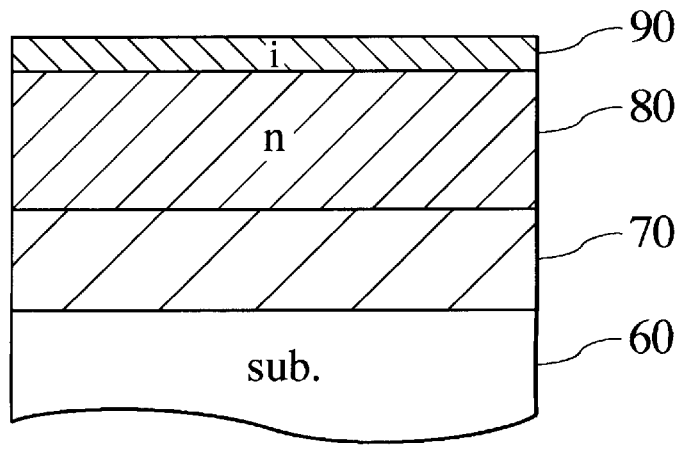

Then, as shown in FIG. 4C, the active layer 90 of about 0.2 μm thickness is formed of the InGaN film on the n-type cladding layer 80 by the MOCVD method.

As film forming conditions of the active layer 90, the substrate temperature is set to about 780° C., and the ambient pressure is set to about 1 Pa. Trimethylindium (TMI), dimethylzinc (DMZ) and the monosilane gas in addition to TMG and NH3 are used as the reaction gas, and nitrogen (N2) and hydrogen (H2) are used as the carrier gas.

As for the flow rates of respective gases, TMG is set at 12 SCCM, NH3 is set at 10 SLM, TMI is set at 150 SCCM, DMZ is set at 20 SCCM, N2 is set at 5 SLM, and H2 is set at 20 SLM. The flow rates of the monosilane gas and DMZ are adjusted such that the active layer 90 is formed substantially as an i-layer.

Figure 4D:
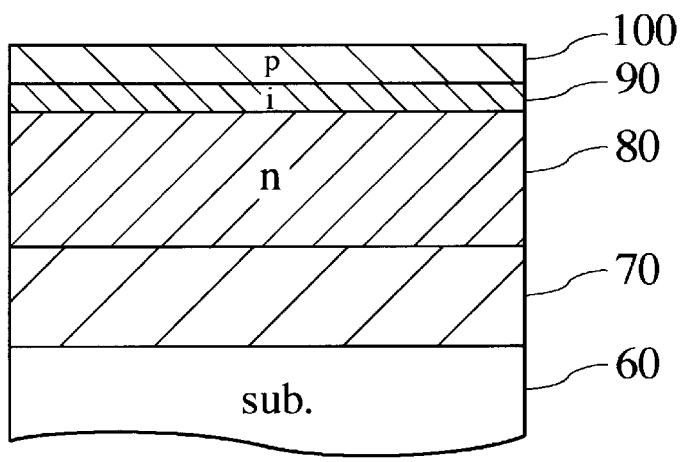

Subsequently, as shown in FIG. 4D, the p-type cladding layer 100 of about 0.3 μm thickness is formed of the GaN film on the active layer 90. The p-type cladding layer 100 can be formed by use of the manufacturing method according to the above first embodiment. In other words, the GaN film to which Mg of about $1 \times 10^{20}$ cm$^{-3}$ is added is formed by virtue of the MOCVD method. As film forming conditions at this time, for example, the substrate temperature is set to about 1000° C. to 1200° C., and the ambient pressure is set to 1 atm. TMG and NH3 are used as the reaction gas, Cp2Mg is used as the dopant gas, and nitrogen (N2) and hydrogen (H2) are used as the carrier gas. As for the flow rates of respective gases, TMG is set at 100 SCCM, NH3 is set at 10 SLM, Cp2Mg is set at 50 SCCM, N2 is set at 5 SLM, and H2 is set at 20 SLM.

After the film formation, the substrate 60 is unloaded from the MOCVD chamber and then loaded onto the annealing equipment. The cylindrical quartz chamber shown in FIGS. 1A to 1C may be used in the annealing equipment. But it is needless to say that a chamber having a rectangular sectional shape other than such chamber, a chamber made of material other than quartz, for example, stainless steel (SUS), or the like may be employed.

After the interior of the annealing equipment is sufficiently replaced with N2, the N2 gas is supplied at a predetermined flow rate to flow in parallel to the surface of the substrate 60. For instance, preferably the N2 gas is supplied such that the flow rate of the gas is set to more than 1 SCCM per unit area (1 mm$^2$) of a sectional surface which is taken perpendicular to the flowing direction of the gas. Then, the substrate temperature is raised to about 700° C. while flowing the N2 gas and then such temperature is maintained for about ten minutes.

The acceptor concentration of the GaN film exceeds $1 \times 10^{19}$ cm$^{-3}$ after the annealing process, so that ohmic contact between the GaN film and the electrode can be achieved. Hence, the p-type cladding layer 100 made of such GaN film can be used commonly as the p-type contact layer.

The p-type cladding layer 100 and the p-type contact layer can be formed independently. In this case, the acceptor concentration of the p-type cladding layer 100 after the annealing process should be adjusted to exceed $1 \times 10^{17}$ cm$^{-3}$, preferably $1 \times 10^{18}$ cm$^{-3}$, while the acceptor concentration of the p-type contact layer should be adjusted to exceed $1 \times 10^{19}$ cm$^{-3}$.

Figure 4E:
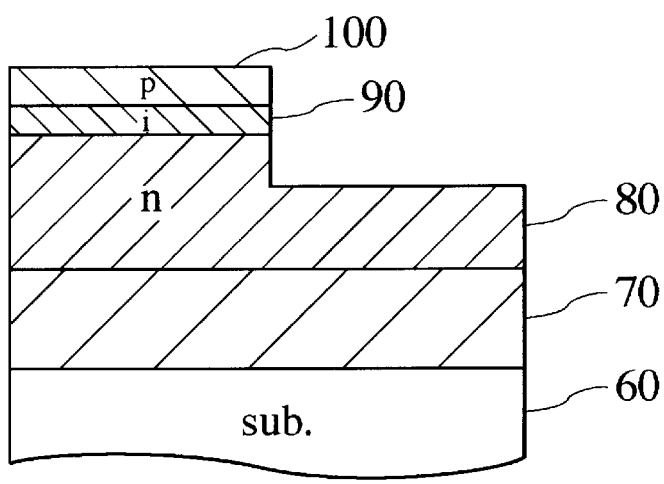

As shown in FIG. 4E, in order to form the electrode, a surface of the n-type cladding layer 80 is exposed by etching the p-type cladding layer 100, the active layer 90, and a part of the n-type cladding layer 80. More particularly, a mask pattern made of SiO2 film, etc. is formed on the GaN compound semiconductor layer structure by the normal photolithography technique and then, using the mask pattern as an etching mask, etching of the above layers may be performed by virtue of reactive ion etching (RIE) method employing the gas to which C12, BC13, etc. are added.

Figure 4F:
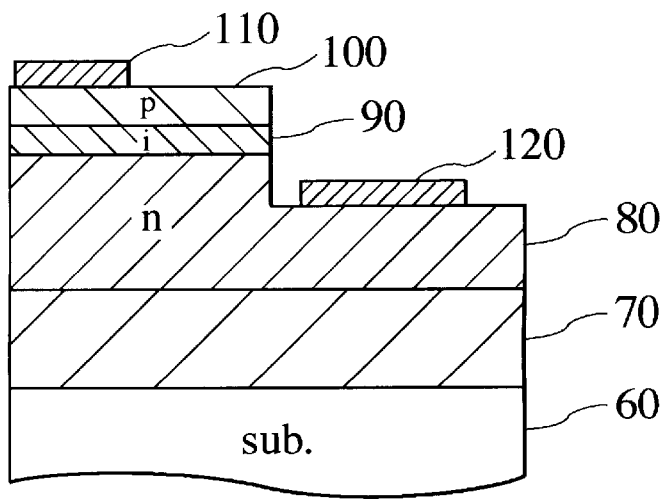

As shown in FIG. 4F, an electrode 110 and an electrode 120 are formed on exposed surfaces of the p-type cladding layer 100 and the n-type cladding layer 80 respectively.

The electrode 110 on the p-type cladding layer 100 can be formed by forming a Ni/Au film composed of an about 20 nm thick nickel (Ni) film and an about 400 nm thick gold (Au) film in terms of the sputtering method and then patterning the Ni/Au film in terms of the photo-lithography technique. Similarly, the electrode 120 on the n-type cladding layer 80 can be formed by forming a Ti/Au film composed of an about 20 nm thick titanium (Ti) film and an about 400 nm thick gold (Au) film in terms of the sputtering method and then patterning the Ti/Au film in terms of the photolithography technique.

Then, a passivation film (not shown) made of an SiO2 film, etc. is formed on the surface of the substrate, whereby a light emitting device structure can be accomplished.

With the above manufacturing steps, the blue light-emitting diode having the so-called DH structure in which a small bandgap active layer 90 is interposed between the large bandgap p-type cladding layer 100 and the large bandgap n-type cladding layer 80 has been finished, as shown in FIG. 4F. It is of course that, in the present invention, the structure of the light emitting diode is not limited to such structure.

For example, as shown in FIG. 5, the PN junction type blue light-emitting diode may be formed. In the PN junction type blue light-emitting diode, a buffer layer 210 made of the GaN semiconductor layer is formed a sapphire substrate 200, and then a PN junction consisting of an n-type GaN layer 220 and a p-type GaN layer 230 is formed on the buffer layer 210. A part of the n-type GaN layer 220 is exposed by etching a part of the laminated film, and then an electrode 240 and an electrode 250 are formed on the n-type GaN layer 220 and the p-type GaN layer 230 respectively.

The buffer layer 210 can also be formed in the same way as the buffer layer 70 of the above DH type light emitting diode. The n-type GaN layer 220 and the p-type GaN layer 230 can also be formed in the same way as the n-type cladding layer 80 and the p-type cladding layer 100 of the above DH type light emitting diode. The electrode 240 and the electrode 250 can also be formed in the same way as the electrode 120 and the electrode 110 of the above DH type light emitting diode.

With the above, the example of the method for manufacturing the blue light-emitting diode has been explained in which the p-type cladding layer is formed by the method for manufacturing the p-type GaN compound semiconductor discussed in the first embodiment. Similarly, the p-type cladding layer can be formed by the manufacturing methods discussed previously in the second embodiment or the third embodiment. According to any of the manufacturing methods, the low-resistivity p-type cladding layer which has the high activation yield can be formed. Of course, the p-type contact layer can be formed similarly.

V. Fifth Embodiment

A fifth embodiment of the present invention is manufacture of a semiconductor laser. More particularly, in the fifth embodiment of the present invention, a semiconductor laser using the p-type GaN compound semiconductor fabricated by the manufacturing methods discussed previously in the first to third embodiments will be explained hereunder.

Figure 6:
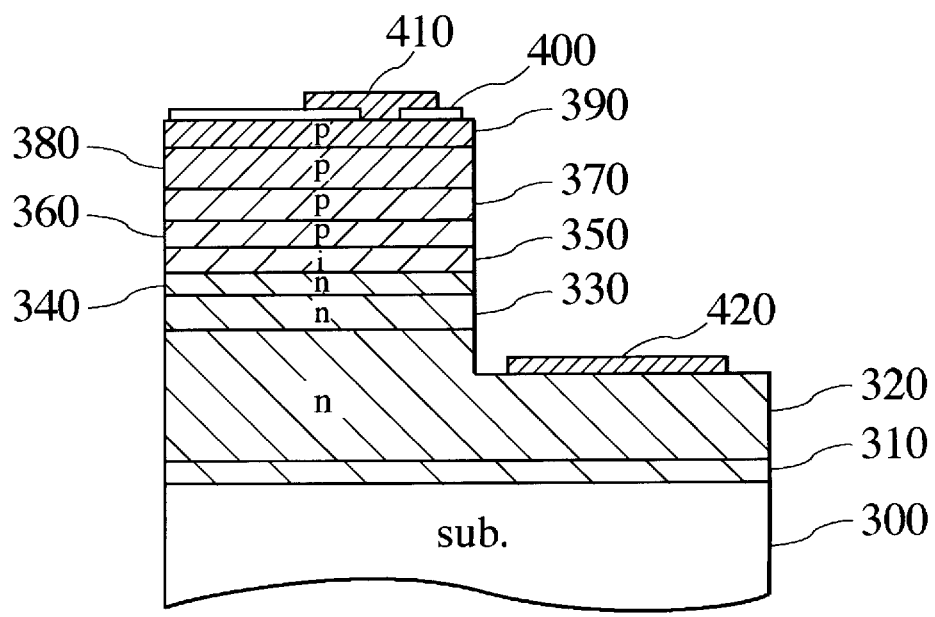
FIG. 6 is a sectional view showing a structure of a semiconductor laser according to a fifth embodiment of the present invention.

FIG. 6 shows an example of a sectional structure of a semiconductor laser according to a fifth embodiment of the present invention.

As shown in FIG. 6, a buffer layer 310 of about 50 nm thickness, an n-type contact layer 320 of about 4 $\mu$m thickness, an n-type semiconductor layer 330 of about 0.3 $\mu$m thickness, an n-type cladding layer 340 of about 0.2 $\mu$m thickness, an active layer 350 of about 50 nm, a p-type cladding layer 360 of about 0.2 $\mu$m thickness, a p-type semiconductor layer 370 of about 0.3 $\mu$m thickness, a p-type semiconductor layer 380 of about 0.9 $\mu$m thickness, and a p-type contact layer 390 of about 0.1 $\mu$m thickness are formed in sequence on a sapphire substrate 300 of about 70 $\mu$m thickness. All these layers are formed of the GaN compound semiconductor layers.

Like the light emitting diode shown in FIG. 5, a part of these laminated layers 320 to 390 made of the GaN compound semiconductor are etched to expose the n-type contact layer 320. An electrode 420 which is fabricated by laminating Ti, Au, Ti, Au in order from the bottom is formed on the n-type contact layer 320. Such laminated Ti, Au, Ti, Au films have a thickness of 200 $\mu$m, 400 $\mu$nm, 200 $\mu$m, and 1 $\mu$m from the bottom respectively.

In addition, an SiO2 film 400 is formed on the p-type contact layer 390. An electrode 410 which is fabricated by laminating platinum (Pt), Ti, Pt, Ti in order from the bottom is formed on the SiO2 film 400. Such laminated Pt, Ti, Pt, Ti films have a thickness of 200 $\mu$m, 400 nm, 200 $\mu$m, and 1 $\mu$m from the bottom respectively. The electrode 410 is connected to the p-type contact layer 390 via an opening formed in the SiO2 film 400.

An In(x)Ga(1−x)N compound semiconductor having a quantum well structure may be used as the active layer 350. For instance, a multi-layered quantum well structure may be employed which can be formed by laminating an In(0.05) Ga(0.95) (x=0.05) layer having a thickness of about 2.5 nm and an In(0.2)Ga(0.8) (x=0.20) layer having a thickness of about 2.5 nm alternatively up to twenty periods.

For example, the carrier concentration in respective p-type or n-type layers can be set in the following. The n-type contact layer 320 is about $2\times10^{18}$ cm$^{-3}$, the n-type semiconductor layer 330 is about $5\times10^{17}$ cm$^{-3}$, the n-type cladding layer 340 is about $5\times10^{17}$ cm$^{-3}$, the p-type cladding layer 360 is about $5\times10^{17}$ cm$^{-3}$, the p-type semiconductor layer 370 is about $5\times10^{17}$ cm$^{-3}$, the p-type semiconductor layer 380 is about $3\times10^{18}$ cm$^{-3}$, and the p-type contact layer 390 is about $2\times10^{19}$ cm$^{-3}$.

A structure of the above semiconductor laser is different from that of the light emitting diode discussed in the above fourth embodiment, but the methods for manufacturing respective n-type and p-type GaN compound semiconductor layers constituting respective semiconductor devices are common to the manufacturing method using the MOCVD method, which has been discussed previously in the fourth embodiment.

Especially, in the above-mentioned semiconductor laser, the p-type cladding layer 360, the p-type semiconductor layers 370, 380, and the p-type contact layer 390, all layers being made of p-type GaN compound semiconductor layers, can be fabricated by any one of the manufacturing methods set forth in the first to third embodiments.

The present invention has been explained as above along with the embodiments, but the present invention should be interpreted not to be limited to these embodiments.

According to the present invention, if the GaN compound semiconductor films to which the p-type impurity is added are subjected to the annealing process while flowing the inert gas at a constant flow rate after such GaN compound semiconductor film has been formed by virtue of chemical vapor deposition, the activation yield of the p-type impurity in the film can be improved significantly rather than the case where the GaN compound semiconductor films are subjected to the annealing process performed only by heating in the prior art.

In addition, the activation yield of the p-type impurity in the film can be improved similarly by executing the annealing process under the condition of applying the inert gas pressure.

The p-type GaN compound semiconductor layer which has fewer lattice defects, etc. and has lower resistivity can be formed by improving the activation yield.

Besides, by utilizing the p-type GaN compound semiconductor layer fabricated by the manufacturing method of the present invention as the p-type cladding layer or the p-type contact layer, the light emitting device such as the blue light-emitting diode, the semi-conductor laser, etc., which are able to have small power consumption and strong light emission intensity, can be provided.

Various modifications will become possible for those skilled in the art after receiving the teachings of the present disclosure without departing from the scope thereof.

What is claimed is:

1. A method for manufacturing p-type gallium nitride compound semiconductor layers, comprising the steps of:

forming p-type gallium nitride compound semiconductor layers, to which p-type impurity is added, by virtue of chemical vapor deposition; and thermally annealing the p-type gallium nitride compound semiconductor layers at more than 400° C. while supplying a flow of an inert gas in parallel to at least surfaces of the p-type gallium nitride compound semiconductor layers;

wherein a flow rate of the inert gas is set to more than 0.3 SCCM per unit sectional area perpendicular to a flow direction.

2. The method as set forth in claim 1, wherein the thermally annealing step is composed of the step of thermally annealing the p-type gallium nitride compound semiconductor layers at more than 700° C.

3. The method as set forth in claim 1, wherein the flow rate of the inert gas is set to more than 0.5 SCCM per unit sectional area perpendicular to the flow direction.

4. The method as set forth in claim 1, wherein the flow rate of the inert gas is set to provide an average line velocity of more than 5 mm/min.

5. A method for manufacturing p-type gallium nitride compound semiconductor layers, comprising the steps of:

forming p-type gallium nitride compound semiconductor layers, to which p-type impurity is added, by virtue of chemical vapor deposition; and thermally annealing the p-type gallium nitride compound semiconductor layers at more than 400° C. in an inert gas atmosphere;

wherein the thermally annealing step is composed of the step of thermally annealing the p-type gallium nitride compound semiconductor layers while supplying a flow of an inert gas in parallel to at least surfaces of the gallium nitride compound semiconductor layer, and wherein the inert gas atmosphere is set to more than 1 atm and a flow rate of the inert gas is set to more than 0.3 SCCM per unit sectional area perpendicular to a flow direction.

6. A method for manufacturing p-type gallium nitride compound semiconductor layers, comprising the steps of:

forming p-type gallium nitride compound semiconductor layers, to which p-type impurity is added, by virtue of chemical vapor deposition; and thermally annealing the p-type gallium nitride compound semiconductor layers at more than 400° C. in an inert gas atmosphere;

wherein the thermally annealing step is composed of the step of thermally annealing the p-type gallium nitride compound semiconductor layers while supplying a flow of an inert gas in parallel to at least surfaces of the gallium nitride compound semiconductor layer, wherein the inert gas atmosphere is set to more than 1 atm and a flow rate of the inert gas is set to more than 0.5 SCCM per unit sectional area perpendicular to a flow direction.

7. A method for manufacturing p-type gallium nitride compound semiconductor layers, comprising the steps of:

forming p-type gallium nitride compound semiconductor layers, to which p-type impurity is added, by virtue of chemical vapor deposition; and thermally annealing the p-type gallium nitride compound semiconductor layers at more than 400° C. in an inert gas atmosphere;

wherein the thermally annealing step is composed of the step of thermally annealing the p-type gallium nitride compound semiconductor layers while supplying a flow of an inert gas in parallel to at least surfaces of the gallium nitride compound semiconductor layer, wherein the inert gas atmosphere is set to more than 1 atm and a flow rate of the inert gas is set to provide an average line velocity of more than 5 mm/min.

8. The method as set forth in any of claims 1 to 4 or 6 to 7, wherein the inert gas is a nitrogen gas or a mixed gas including the nitrogen gas.

* * * * *